US006303440B1

United States Patent
Araki et al.

(10) Patent No.: US 6,303,440 B1
(45) Date of Patent: Oct. 16, 2001

(54) NONVOLATILE SEMICONDUCTOR MEMORY, AND METHOD OF MANUFACTURING THE SAME

(75) Inventors: Yoshiko Araki, Kanagawa-ken; Seiichi Mori, Tokyo, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/222,778

(22) Filed: Dec. 30, 1998

Related U.S. Application Data

(63) Continuation of application No. 08/720,729, filed on Oct. 1, 1996, now Pat. No. 5,882,994.

(30) Foreign Application Priority Data

Oct. 2, 1995 (JP) .................................................. 07-254784

(51) Int. Cl.[7] .............................................. H01L 21/8247
(52) U.S. Cl. ........................................ 438/261; 438/593
(58) Field of Search .................................. 438/593–594, 438/257–267

(56) References Cited

U.S. PATENT DOCUMENTS

| | | |
|---|---|---|
| 4,249,968 | 2/1981 | Gardiner et al. . |
| 4,874,716 * | 10/1989 | Rao . |
| 4,992,391 | 2/1991 | Wang ..................................... 437/43 |
| 5,147,813 | 9/1992 | Woo ....................................... 437/43 |
| 5,256,894 | 10/1993 | Shino ..................................... 257/388 |
| 5,289,026 | 2/1994 | Ong ........................................ 257/316 |
| 5,439,838 | 8/1995 | Yang ........................................ 437/43 |
| 5,445,982 | 8/1995 | Hwang ..................................... 437/43 |
| 5,801,076 * | 9/1998 | Ghneim et al. ......................... 438/261 |
| 5,882,994 * | 3/1999 | Araki et al. ............................. 438/593 |
| 5,981,339 * | 11/1999 | Chang et al. ........................... 438/257 |

FOREIGN PATENT DOCUMENTS

| | | |
|---|---|---|
| 0 287 031 | 10/1988 | (EP) . |
| 0 528 564 | 2/1993 | (EP) . |
| 0 560 435 | 9/1993 | (EP) . |
| 61-190981 | 8/1986 | (JP) . |
| 63-255972 | 10/1988 | (JP) . |

OTHER PUBLICATIONS

Wolf et al., "Silicon Processing for the VLSI Era vol. 1: Process Technology", Lattice Press, pp. 164–169 (1986).

* cited by examiner

*Primary Examiner*—Richard Booth
(74) *Attorney, Agent, or Firm*—Finnegan, Henderson, Farabow, Garrett & Dunner, L.L.P.

(57) ABSTRACT

A method of manufacturing the semiconductor memory comprises element described below;
  (a) forming a first oxide film on a semiconductor substrate;
  (b) forming a polysilicon electrode on the first oxide film by sub-steps of forming a low impurity density polysilicon layer, forming a high impurity density polysilicon layer, and forming a low impurity density polysilicon layer in this order;
  (c) forming a second oxide film on the polysilicon electrode.

5 Claims, 3 Drawing Sheets

NONVOLATILE SEMICONDUCTOR MEMORY, AND METHOD OF MANUFACTURING THE SAME

This is a continuation of application Ser. No. 08/720,729, filed Oct. 1, 1996 (now U.S. Pat. No. 5,882,994), which is incorporated herein by reference.

BACKGROUND OF THE INVENTION

1. Field Related to the Invention

The present invention concerns a method for manufacturing a semiconductor, in particular a method for manufacturing a two-layered structure of a nonvolatile semiconductor memory.

2. Description of the Related Art

In the memory cell array of the nonvolatile semiconductor memory, there is a structure which contains the two-layered gate structure comprising a floating gate, which is electrically insulated from the periphery, in addition to a control gate of a usual gate.

The structure of the nonvolatile memory, which includes the conventional two-layered structure, is described in FIG. 1.

Cell gate oxide film 83 (about 100 angstrom thick) is formed on the surface within the region enclosed by field oxide film 82, which is formed on semiconductor substrate 81, while floating gate 84 (about 1000 angstrom to 2000 angstrom thick) is formed on cell gate oxide film 83. On the further upper side, for example, control gate 86 of polysilicon WSi 2000 angstrom/1200 angstrom is formed by ONO (oxide/nitride/oxide) insulation film 85 containing a three layer structure, such a as silicone oxide film/silicone nitride layer/silicone oxide layer of 50~60 angstrom/60 angstrom/50~60 angstrom, respectively, which form the MOS transistor.

When electrons are involved in floating gate 84, the channel cannot be easily induced by the negative charge of electrons, even if a word line attains a high voltage, where the threshold voltage rises too high to turn on. When electrons are not involved in floating gate 84, a high voltage is applied to control gate 86 to turn on this transistor, if the word line attains a high voltage, where this transistor is turned on.

On the other hand, electrons can be accumulated in floating gate 84, by regulating the voltage to apply to control gate 86 and a drain region (not depicted in the Figures).

Floating gate 84 is formed by diffusing an N type impurity, for instance, phosphorus, to attain a uniform density after deposition of polysilicon.

Meanwhile, a bottom oxide film, a silicon oxide film of the lowest layer for ONO insulating film 85, is formed by oxidizing polysilicon by thermal oxidation, where the impurity pertaining to floating gate 84 is diffused. This oxidation should proceed at the high temperature of about 850~1000 C. in order to obtain sufficient insulation characteristics and charge storage characteristics. This process uses ONO insulating film 85 in three layers, which have, for instance, enhanced charge storage characteristics, rather than formation with the single silicon oxide film layer only.

However, when the memory cell is formed using the above-mentioned method, phosphorus within floating gate 84 is diffused into the cell gate oxide film through the route shown in FIG. 1 in the course of the oxidation process for the bottom oxide film, which results in structural damage within the cell gate oxide film. Moreover, it invokes a problem concerning reliability with an increase in the leak current.

Furthermore, because floating gate 84 is formed through the route indicated by arrow 2 in FIG. 1, phosphorus in polysilicon is involved in the bottom oxide film during oxidation of polysilicon, which results in degradation in the bottom oxide film quality.

Also, the oxidation rate for polysilicon containing abundant phosphorus is quickened by, that is, accelerating phenomena, which invokes a problem in the film thickness controllability. Moreover, it makes it difficult to form the desired oxide film in the desired thin film.

In the preprocess used in forming the bottom oxide film, a polysilicon surface containing phosphorus is flooded with some liquid during a chemical process, e.g. wafer cleaning process, or exposed an atmosphere, which brings up oxidation, while a rough natural oxide film will be formed. In such a thick region, where the bottom oxide film thickness exceeds 10 nm, the influence of the above-mentioned natural oxide film can be ignored. However, when the bottom oxidation film thickness must be minimized to less than 10 nm, corresponding to micronization of devices, any incorrect quality natural oxidation film, 2 to 3 nm thick, cannot be ignored, where countermeasures must be taken.

The natural oxide film had been formed before the oxide film deposition, even with the LP-CVD (Low pressure-Chemical Vapor Deposition) chamber of about 700° C., usually when the bottom oxide film was formed by the LP-CVD method.

These natural oxide films have changed the film quality and the film thickness according to exposure time and process conditions of the wafer, which deteriorates the film thickness and the film quality control of the bottom oxide film.

In addition, the natural oxide film is incorrect in regard to the film quality, which results in degradation of the bottom oxide resulting in wrong film quality, often represented in insulation resistance, etc.

As mentioned above, there is a problem wherein the degradation in the cell gate oxide film quality occurs due to the affects of phosphorus in the floating gate in a conventional invention, which results in reliability degradation, and the controllability of the bottom oxide film cannot be improved to achieve excellent film quality with thin film thickness.

SUMMARY OF THE INVENTION

It is an object of the present invention to prevent any damage to the call gate oxide film, and to provide a method for manufacturing a nonvolatile semiconductor memory to form a bottom oxide film which is excellent in film quality.

BRIEF DESCRIPTION OF THE DRAWINGS

A more complete appreciation of the present invention and many of its attendant advantages will be readily obtained by reference to the following detailed descriptions, considered in connection with the accompanying drawings, in which.

DETAILED DESCRIPTION OF THE PREFERRED EMBODIMENTS

Embodiments of the present invention will be described in details with reference to the drawings.

FIGS. 2–8 are sectional views showing the nonvolatile semiconductor memory in, and the manufacturing process concerned with, the embodiment system for this invention.

Figure 1:
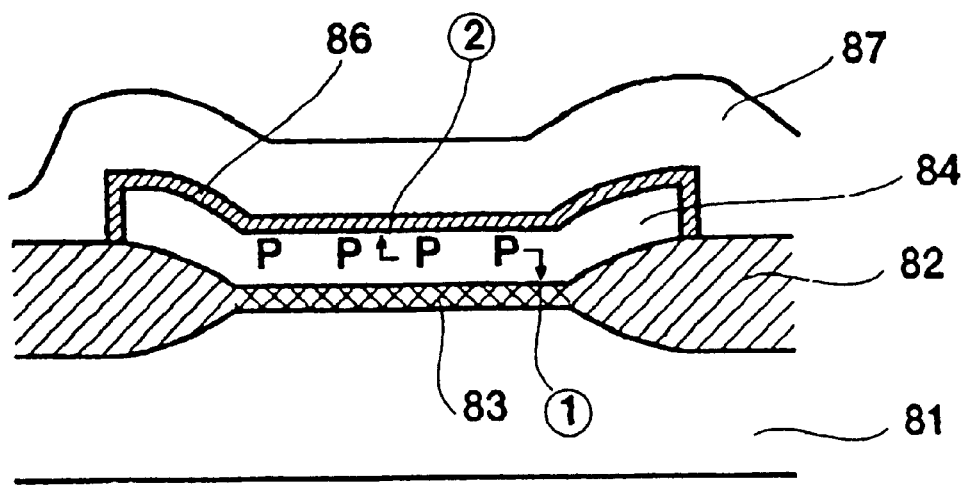
FIG. 1 is a sectional view showing a conventional example.
Figure 2:
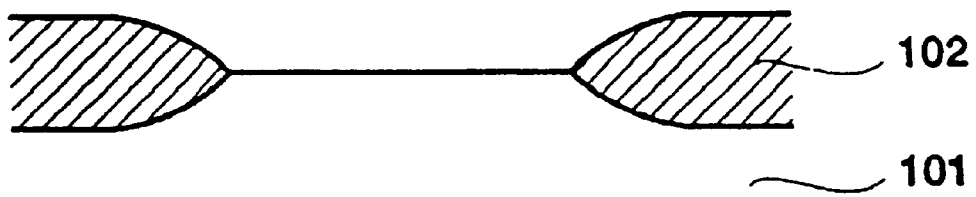
FIG. 2 is a sectional view showing a manufacturing process used in applying this invention.
Figure 3:
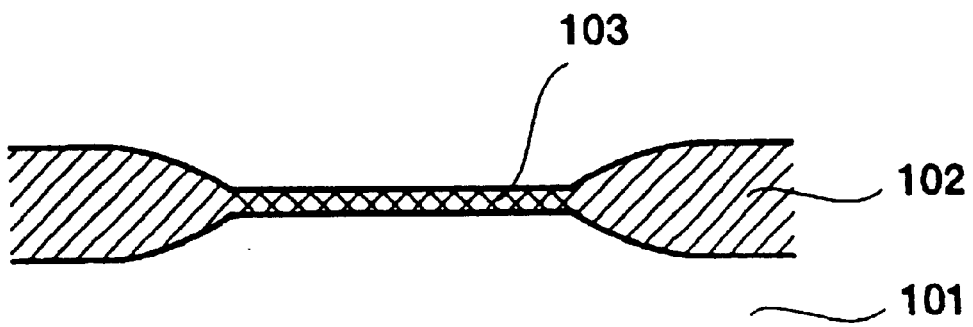
FIG. 3 is a sectional view showing a manufacturing process used in applying this invention.

In the first step, field oxide film 102 is formed on the fixed region of P type silicon substrate 101 surface, using a selective oxidation, e.g. LOCOS (local oxidation) for the element isolation, as shown in FIG. 2. Then cell gate oxide film 103, 10 nm thick is formed on the element region on P type silicon substrate 101, as shown in FIG. 3.

Figure 4:
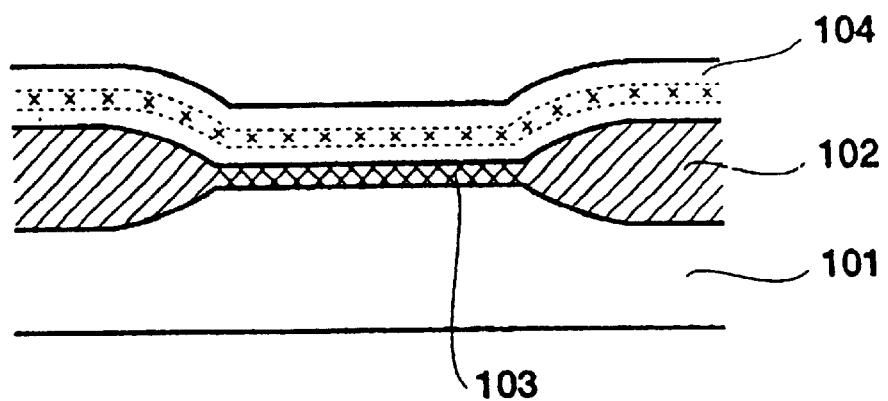
FIG. 4 is a sectional view showing a manufacturing process used in applying this invention.

Next, the first polysilicon layer 104 is formed on cell gate oxide film 103 by the LP-CVD method, as shown in FIG. 4. This first polysilicon layer 104 is formed so as to configure three-layered structure such as non-doped polysilicon/impurity doped polysilicon/non-doped polysilicon, while changing the deposition condition.

At this step, thickness and impurity density for each polysilicon film of the three layers is set so that the, cubic density can exceed $3 \times 10^{19}$ cm$^{-3}$ in e.g. in a situation where the impurity is uniformly diffused in the thermal process thereafter. In other words, when 70 nm non-doped polysilicon layer/70 nm polysilicon layer containing phosphorus in a $1 \times 10^{20}$ cm$^{-3}$/70 nm non-doped polysilicon layer are used as the first polysilicon layer 104, the phosphorus density in the polysilicon layer attains $3 \times 10^{19}$ cm$^{-3}$, when the impurity is diffused uniformly. However, it is not desirable that the comparative impurity density in the polysilicon layer be too low to ignore a potential fall in polysilicon.

Figure 5:
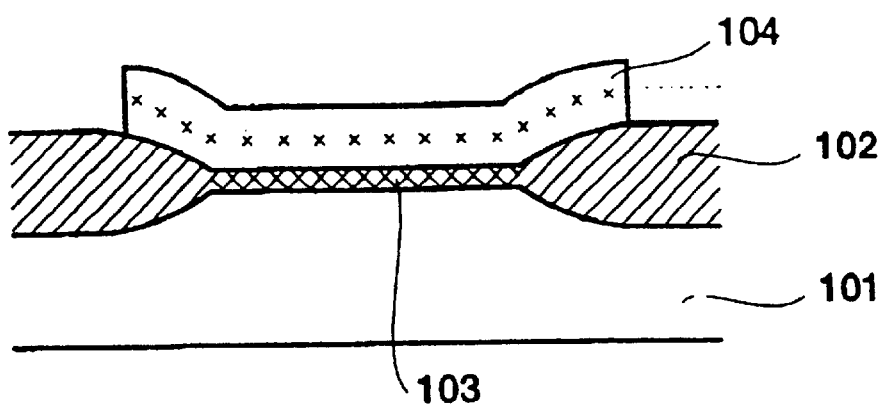
FIG. 5 is a sectional view showing a manufacturing process used in applying this invention.

After a selective etching is performed for first polysilicon layer 104, on the field oxide film 102 using the photoresist (not depicted in the figure) as a mask formed on the first polysilicon layer 104 as shown in FIG. 5. In this process, the length is defined in one direction of floating gate in the two layered gate structure. After that, the photoresist (not depicted in the figure) is removed.

Sequentially, thermal oxidation is provided for the first polysilicon layer 104, as shown in FIG. 5, to form bottom oxide film 105. At this time, as the surface of the first polysilicon layer 104 is a polysilicon (non-doped polysilicon) which does not contain any impurity as mentioned above, the formation of the oxide film can be controlled in the oxidation preprocess, such as the cleaning process or the transfer process to the oxidation chamber.

On the other hand, it is generally preferable to improvement in the oxide film quality to process the polysilicon oxidation at the high temperature. However, the impurity diffuses by heat in the oxidation process, which will cause impurity involution in the bottom oxide film. Moreover, it causes damage to the cell gate oxide film, and results in deterioration of the film quality. In order to avoid these problems as much as possible and to form good oxide film quality, it is recommended to employ the following method.

First there is a method for oxidation at high-velocity in a short time at about e.g. 1000° C., using the rapid thermal anneal (RTA) equipment. This method can be used to form a bottom oxide film, excellent in film quality, thus shortening the anneal time.

Next, the same effect as that achieved by the above-mentioned method can be accomplished by oxidizing the wafer at the low temperature of 700° C., during processing at temperature rise and temperature fall at a high-velocity of e.g. 50 to 100° C./minute, approximately, while employing a usual oxidation chamber.

Moreover, in case of the low temperature oxidation, the polysilicon surface at the lower temperature in general appears in the more even surface, where it is easy for the impurity (phosphorus) to deposit on the grain boundary of the polysilicon crystal. This deposition impurity (phosphorus) is involved in the bottom oxide film, which will cause film quality degradation. However, the impurity density in the oxidized polysilicon surface is originally low, while grown oxidation film thickness is a maximum of only 10 nm, which can prevent uneven formation, according to the structure of this invention. Therefore, it is possible to control degradation to the bottom oxide film quality compared with conventional cases, even with the oxidation at low temperatures of 700° C. to 800° C.

Even with the oxidation at high temperatures of 1000° C. to 1100° C., needless to say, it is possible to get further excellent oxidation film quality according to the structure of this invention, compared with oxidation of polysilicon to uniformly diffuse conventional impurity.

On the other hand, it is recommended to deposit and form the silicon oxide film for the formation of the bottom oxide film by using the LP-CVD (Low Pressure-Chemical Vapor Deposition) method, which can form it at the low temperature, not by thermal oxidation. According to the LP-CVD method, the silicon oxide film can be deposited at 700 C.~800 C. Therefore, the structure of this invention can effectively decrease the damage which the impurity (phosphorus) especially gives to the cell gate oxide film. There are some cases for deposition in the usual LP-CVD chamber, where a wafer is inserted in the chamber at 700° C. to 800° C., natural oxide film is formed. This results in low controllability of deposition oxide film thickness, and causes deterioration in the entire film quality. Meanwhile, the structure of this invention can control the formation of the natural oxide film, because the impurity density in the oxidized polysilicon layer surface is low.

Whether the oxidation or deposition can be used, as mentioned above, in the structure of this invention an excellent bottom oxide film can be obtained, because the uppermost layer of the polysilicon does not contain phosphorus. Because the lowest layer of the polysilicon layer touching the cell gate oxide film does not contain phosphorous, it is easy to control phosphorus which causes damage to the cell gate oxide film in the oxidation process.

Figure 6:
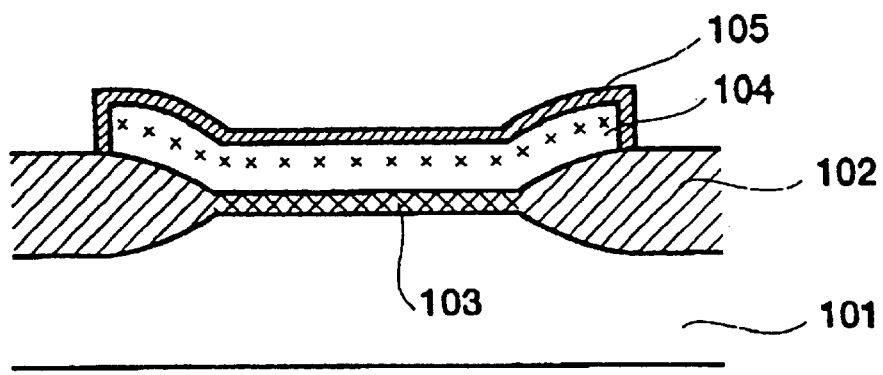
FIG. 6 is a sectional view showing a manufacturing process used in applying this invention.
Figure 7:
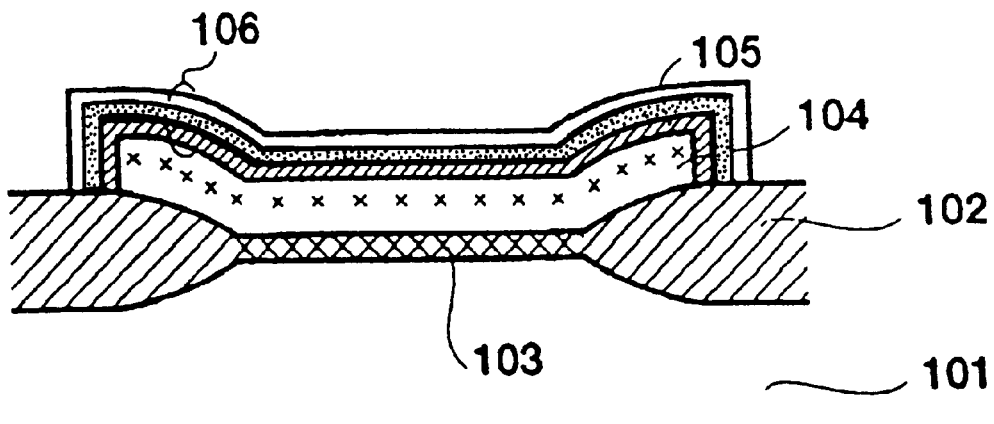
FIG. 7 is a sectional view showing a manufacturing process used in applying this invention.

As shown FIG. 6, the nitride film, in 15 nm thick, is deposited on the bottom oxide film 105 using the LP-CVD method. ONO oxide film 106 is formed on the bottom oxide film 105 with the burning oxidation at 950° C. for this nitride film as shown in FIG. 7.

Figure 8:
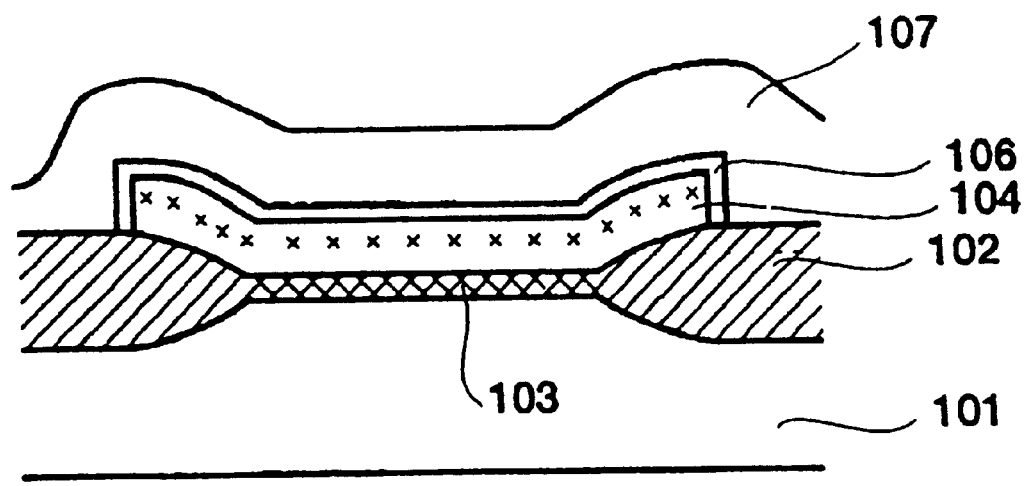
FIG. 8 is a sectional view showing a manufacturing process used in applying this invention.

Next, the second polysilicon layer 107 is deposited, as shown in FIG. 8. Then, the photoresist (not depicted in the Figure) is formed. This resist is used as a mask, second polysilicon layer 107, ONO oxide film 106, first polysilicon layer 104, cell gate oxide film 103 are etched in order, while the control gate is formed using the second polysilicon layer 107, and the floating gate formed by first polysilicon layer 104. Consequently, to form the N type diffused layer, which becomes a source drain, an impurity, e.g. As is implanted in the surface of said silicon substrate 101. Simultaneously, an ion implantation defect occur. The ion implantation defect is restored by implanting arsenic. Then, an oxide film is formed on the periphery of the cell through post oxidation to cover the surroundings of floating gate. Successively, an interlayer insulating layer is formed on the oxide film, and aluminium is deposited on the interlayer insulating layer as an Al wiring layer.

This embodiment has changed deposition conditions during depositing polysilicon, so as to change the impurity density of polysilicon layer 104, but is not limited to this method. It is preferable to implement the impurity under the condition of the acceleration voltage of e.g. 30 to 40 KeV, so that the impurity is implemented into the center of the thickness of the polysilicon layer, using ion implantation after deposition of the polysilicon layer, which does not contain any impurity, for instance.

In this embodiment, the distribution of impurity density in polysilicon is divided into three layers of non-doped polysilicon layer/polysilicon layer containing phosphorus of about $1 \times 10^{20}$ cm$^{-3}$/non-doped polysilicon layer. There is no problem if the impurity density of the layers at both upper and lower sides is low, even if the inner layer forms a mufti layer. For example, the structure may be configured in such layers as non-doped polysilicon layer/polysilicon layer containing phosphorus of about $1 \times 10^{20}$ cm$^{-3}$/non-doped polysilicon layer/polysilicon layer containing phosphorus of about $1 \times 10^{20}$ cm$^{-3}$/non-doped polysilicon layer.

The floating gate structure of this embodiment considers the diffusion of phosphorus, the entire process is designed in the annealing processes of the ONO oxide film formation and the post oxidation process, considering upper and lower diffusion, so that the phosphorus density may exceed $3 \times 10^{19}$ cm$^{-3}$ in any region within the floating gate polysilicon, when the element is completed.

According to the method of manufacturing the nonvolatile semiconductor memory of this invention, as mentioned above, it is possible not only to prevent damage to the cell gate oxide film due to the impurity in polysilicon, but it is also possible to control the bottom oxide film and minimize the natural oxide film formation before the formation. It is also possible to form the bottom oxide film with an excellent film quality by preventing any impurity from being involved in the grown oxide film, which can result in great improvement in reliability of the element.

While there have been illustrated and described what factors are presently considered to be in the preferred embodiments of the present invention, it will be understood by those skilled in the art that various changes and modifications may be made, and equivalents may be substituted for devices thereof without departing from the true scope of the invention. In addition, many modifications may be made to adapt to a particular situation or material regarding the teaching of the present invention without departing from the central scope thereof. Therefore, it is intended that this invention not be limited to the particular embodiment disclosed as the best mode contemplated for carrying out this invention, but that the invention include all embodiments falling within the scope of the appended claims.

What is claimed is:

1. A method of manufacturing a nonvolatile semiconductor memory comprising:

forming a first insulating layer on a semiconductor substrate;

forming a first polysilicon layer, as a floating gate, on the first insulating layer, the first polysilicon layer including a first low-impurity polysilicon portion facing the first insulating layer, a high-impurity polysilicon portion, and a second low-impurity polysilicon portion;

forming a second insulating layer on the second low-impurity polysilicon portion, including sequentially forming a silicon oxide film using low pressure-chemical vapor deposition, a silicon nitride film, and a silicon oxide film; and forming a second polysilicon layer, as a control gate, on the second insulating layer.

2. A method of manufacturing a nonvolatile semiconductor memory comprising:

forming a first insulating layer on a semiconductor substrate;

forming a first polysilicon layer, as a floating gate, on the first insulating layer, the first polysilicon layer including a first polysilicon portion being in contact with the first insulating layer, a second polysilicon portion, and a third polysilicon portion formed in that order, wherein the second polysilicon portion is made to have an impurity concentration higher than that of the first and third polysilicon portions;

forming a second insulating layer on the third polysilicon portion, including forming a silicon oxide film using low pressure-chemical vapor deposition and forming a silicon nitride film; and forming a second polysilicon layer, as a control gate, on the second insulating layer.

3. A method of manufacturing a nonvolatile semiconductor memory comprising:

forming a first insulating layer on a semiconductor substrate;

forming a first polysilicon layer, as a floating gate, on the first insulating layer, the first polysilicon layer including a first polysilicon portion being in contact with the first insulating layer, a second polysilicon portion, and a third polysilicon portion formed in that order, wherein the second polysilicon portion is made to have an impurity concentration higher than that of the first and third polysilicon portions;

forming a second insulating layer on the third polysilicon portion, including sequentially forming a silicon oxide film using low pressure-chemical vapor deposition, a silicon nitride film, and a silicon oxide film; and forming a second polysilicon layer, as a control gate, on the second insulating layer.

4. A method of manufacturing a nonvolatile semiconductor memory comprising:

forming a first insulating layer on a semiconductor substrate;

forming a first polysilicon layer, as a floating gate, on the first insulating layer, the first polysilicon layer including a high-impurity polysilicon portion and a low-impurity polysilicon portion formed alternately, wherein the lowermost and uppermost portions of the polysilicon portions are formed to have a low impurity concentration;

forming a second insulating layer on the uppermost polysilicon portion, including forming a silicon oxide film using low pressure-chemical vapor deposition and forming a silicon nitride film; and forming a second polysilicon layer, as a control gate, on the second insulating layer.

5. A method of manufacturing a nonvolatile semiconductor memory comprising:

forming a first insulating layer on a semiconductor substrate;

forming a first polysilicon layer, as a floating gate, on the first insulating layer, the first polysilicon layer including a high-impurity polysilicon portion and a low-impurity polysilicon portion formed alternately, wherein the lowermost and uppermost portions of the polysilicon portions are formed to have a low impurity concentration;

forming a second insulating layer on the uppermost polysilicon portion, including sequentially forming a silicon oxide film using low pressure-chemical vapor deposition, a silicon nitride film, and a silicon oxide film; and forming a second polysilicon layer, as a control gate, on the second insulating layer.

* * * * *